United States Patent [19]
Brown

[11] Patent Number: 5,789,142
[45] Date of Patent: Aug. 4, 1998

[54] SOLDER MASK SYSTEM

[75] Inventor: Vernon L. Brown, Barrington, Ill.

[73] Assignee: Motorola, Inc., Schaumburg, Ill.

[21] Appl. No.: 586,531

[22] Filed: Jan. 16, 1996

[51] Int. Cl.⁶ .................................. G03F 7/40; H05K 3/34
[52] U.S. Cl. .................................................. 430/315
[58] Field of Search ...................................... 430/315

[56] References Cited

U.S. PATENT DOCUMENTS

| | | | |
|---|---|---|---|
| 3,649,274 | 3/1972 | Older et al. | 430/315 X |
| 4,902,610 | 2/1990 | Shipley | 430/312 |
| 5,162,144 | 11/1992 | Brown et al. | 428/209 |
| 5,246,817 | 9/1993 | Shipley, Jr. | 430/312 |
| 5,260,170 | 11/1993 | Brown | 430/315 |

Primary Examiner—Cynthia Hamilton
Attorney, Agent, or Firm—Douglas D. Fekete; John B. MacIntyre

[57] ABSTRACT

A masking method employing a photodefinable resin as a permanent dielectric mask, in which the resin contains a catalytic filler that when activated enables direct electroless plating of the resin. The resin serves to simplify selective electroplating of isolated surface features such as metal pads, while also improving the topology of the external surface of the circuit board, particularly when small metal pads require a controlled volume of a reflowable metal. The resin is preferably photodefined to eliminate recessed areas around the metal pads, thereby promoting definition of the metal features, and yielding a nearly planar surface. Additional features that can be provided with the method include external conductive ground planes and electromagnetic shield layers within a multilayer circuit board. The masking method can be advantageously used with both reflowable metals and metal alloys, such as tin/lead, and nonreflowable metals and metal alloys, such as gold, palladium and platinum.

19 Claims, 2 Drawing Sheets

SOLDER MASK SYSTEM

FIELD OF THE INVENTION

The present invention generally relates to printed circuit boards and their fabrication. More particularly, this invention relates to a method for manufacturing a printed circuit board entailing the use of a catalyzed photodefinable resin as a permanent solder mask for defining dielectric and conductive regions of the circuit board.

BACKGROUND OF THE INVENTION

The fabrication of multilayered circuit boards is generally accomplished by depositing a sequence of dielectric and conductor layers, with metallized vias or interlayer interconnections being formed through the dielectric layers in order to electrically interconnect the conductor layers as required. When using conventionally produced printed circuit boards on which a component such as a flip chip is to be mounted, it is necessary to provide "bumps" of a small and well-controlled volume to register with the chip, whose terminals may be approximately 125 micrometers (about five mils) in diameter. FIGS. 1 through 5 illustrate a process adopted by a number of printed circuit manufacturers to selectively electroplate a thick deposit of tin/lead alloy onto pads defined by a solder mask. The tin/lead alloy is then reflowed to form the bumps, whose volumes are controlled by the electroplating process and the mask geometry.

Represented in FIG. 1 is a first step of this process, in which a final permanent solder mask 14 is applied to a printed circuit board 10. The solder mask 14 can be defined in any suitable manner to produce openings 16 that expose metal pads 12 previously formed on the surface of the printed circuit board 10. FIG. 1A is a top view of FIG. 1, and shows one of the openings 16 in the permanent solder mask 14 as being sufficiently large such that, with registration tolerances, the opening 16 exposes the entire width of the metal pad 12 and adjoining surfaces 11 of the board 10. As shown, the opening 16 does not expose the entire length of the metal pad 12, such that the solder mask 14 covers an extended portion 12a of the pad 12. Thus, when the opening 16 is rectangular, a rectangular portion of the pad 12 is exposed.

In preparation for plating, the surface of the solder mask 14 and the exposed surfaces 11 of the circuit board 10 are roughened mechanically or by treating with a chemical such as permanganate, and the pads 12 are chemically etched. Afterwards, an electroless plating precursor containing a colloidal suspension of a metal compound, such as tin, is deposited on the roughened surfaces. The deposited particles are then chemically replaced by a catalyst, usually palladium, in a process well known in the industry. All exposed surfaces of the circuit board 10, pads 12 and solder mask 14 are then electrolessly plated to form a thin copper layer 18, as shown in FIG. 2. If desired, another thin layer of copper (not shown) can be electroplated over the electroless copper layer 18 to promote the robustness of subsequent processing steps.

As shown in FIGS. 3 and 3A, a photoresist 20 is then applied on the copper layer 18, and openings 22 are defined over the pads 12 such that the photoresist 20 serves as a mask that exposes limited surface regions of the copper layer 18 overlying the pads 12 and the surfaces 11 of the circuit board 10. These exposed regions of the copper layer 18 are then selectively electroplated through the openings 22 with a desired plating material 24, for example a tin/lead solder alloy. Thereafter, the photoresist 20 is stripped and exposed regions of the copper layer 18 are etched away to leave the over-plated pads 12 and their plating material 24, as shown in FIG. 4. Finally, the plating material 24 is reflowed to form a bump 26 having the shape shown in FIG. 5. During reflow, copper from the copper layer 18 on the surfaces 11 is dissolved in the tin/lead solder alloy of the plating material 24, and the molten plating material 24 is drawn to the exposed portion of the pad 12, forming the rounded bump 26 shown, which is an alloy containing a small amount of copper and the plating material 24.

As can be appreciated from the above, this prior art process for plating pads with a solder material is rather complex and costly. In addition, it can be seen from FIG. 3A that the area to be plated consists of the solder mask 14, the exposed portion of the pad 12, and the adjoining surfaces 11 of the substrate 10. Solder volume is determined by the photoresist 20, whose opening 22 is wider than the width of the pad 12. Thus, the plating material 24 is plated on the surface 11 of the circuit board 10, as well as the metal pad 12 and solder mask 14. Consequently, this process is not useful for plating a nonreflowable metal, such as gold, palladium and platinum.

Furthermore, the potential for misregistration of the pad 12 relative to the opening 16 in the solder mask 14 necessitates that the opening 16 be large enough that the total width and sidewalls of the pad 12 are not obscured by the solder mask 14, so that the pads 12 can be entirely plated. In addition, the potential for misregistration of the opening 22 in the photoresist 20 necessitates that the opening 22 be still larger than the opening 16 in the solder mask 14 so as to avoid the photoresist 20 overhanging the edge of the solder mask 14, and to avoid the poor and uncontrolled solder plating that would result. Because of the difficulty of obtaining adhesion of the photoresist 20 to the adjoining surfaces 11 of the board 10, the photoresist opening 22 must be made larger than the solder mask opening 16 by the misregistration potential of the opening 16 relative to the opening 22. The net effect is that the terminal spacing must be much larger than is desired. As a result, many otherwise applicable integrated circuits having a pitch smaller than about 0.4 millimeters (about sixteen mils) cannot be used. In addition, less tolerance for misregistration must be used than is desired, such that printed circuit yield is reduced.

In addition, due to the presence of many edges and corners, all of the plating material 24 does not recede to the pad 12, and/or all of the copper layer 18 cannot be etched away. The result is contamination and potential shorting. In addition, because conventional solder mask materials are not designed to be etchable and plateable, it is difficult to ensure that the electroless copper layer 18 will adequately adhere to the solder mask 14 to the extent necessary for reliable electroplating.

Finally, for the process depicted in FIGS. 1 through 5, if electromagnetic shielding or a ground plane is required over traces on the circuit board, such features must be formed during board manufacture and prior to the application of the solder mask, which is always used on high performance printed circuit boards. The cost of the added layer, usually provided on both sides of the printed circuit board, adds substantially to the cost of manufacture.

An improved process for the manufacture of multilayered circuits is disclosed in commonly-assigned U.S. Pat. No. 5,260,170 to Brown, and entails sequential deposition and photo-definition of openings in two resins. One of the resins, referred to as resin A, includes a catalytic filler that can be activated to enable selective electroless plating of the resin with a metal. The second resin, referred to as resin B, does not contain a catalytic filler. According to Brown, resins A and B are sequentially deposited and photochemically patterned, with resin B overlying resin A such that openings in resin B expose regions of resin A that can then be electrolessly plated to form metallic features such as pads, vias and conductors. In this manner, multiple circuit layers can be sequentially formed to produce a desired multilayer printed circuit board.

From the above, it can be seen that the process taught by Brown makes possible a unique masking technique by which metal features can be formed on a catalyzed resin ("resin A") through a photodefinable resin ("resin B"). Brown does not disclose how the use of his catalyzed resin might be applicable to overcoming the difficulties noted with the prior art methods of forming plated bumped metal pads of a printed circuit, as represented in FIGS. 1 through 5, how such a technique may provide a more economical method for forming electromagnetic shielding or a ground plane for a printed circuit board, or how such a masking technique might enable simplified selective electroplating of a plateable metal on an isolated metal pad.

SUMMARY OF THE INVENTION

According to the present invention, there is provided a masking method employing a photodefinable resin as a permanent dielectric mask, in which the resin contains a catalytic filler that when activated enables direct selective electroless plating of the mask. When selectively electrolessly plated, the mask can be used to form metal features that electrically contact metal pads in the surface of a multilayer printed circuit board, in a manner that greatly simplifies the solder bumping of selected pads of a printed circuit board. In this role, the mask is preferably photodefined to eliminate recessed areas around the metal pads, thereby promoting adhesion and definition of the metal features and yielding a more planar surface characterized by improved topology. Metal features that can be defined with the plated mask include nonreflowable metal pads such as gold, palladium and platinum pads, soldered pads, and external conductive ground or shielding planes connected to other points in the multilayer circuit board. Notably, such shielding and grounding features are in the solder mask itself, rather than in the printed circuit board as required by prior art practices. Alternatively, the electroless plating can be subsequently removed from the mask, such that the permanent role of the mask within the multilayer structure is limited to insulate circuit layers separated by the mask. If desired, the catalytic filler within the photodefinable resin need not be activated, such that the photodefinable resin is not plateable but instead serves as a standard insulating, photodefinable solder mask.

The method of this invention generally includes the steps of depositing the photodefinable resin on the surface of a substrate and over a metal region present on the substrate, and then photoimaging and developing an opening in the photodefinable resin so as to expose at least a portion of the metal region. The photodefinable resin may be photoimaged and developed to expose the entire metal region, or to cover any desired portion of the metal region, such as its periphery. Thereafter, the catalytic filler in the photodefinable resin is activated, and a conductive material is electrolessly plated on the photodefinable resin and the exposed portion of the metal region so as to form an electrically conductive layer that is electrically interconnected with the metal region through contact with the photodefinable resin at the edge of the opening. At this level, the conductive layer is able to serve as an external ground plane or a shield for electromagnetic interference (EMI) or radiation from an underlying circuit.

To form a solder pad on the metal region, a sacrificial dielectric material (e.g., photoresist) is deposited over the conductive material, and openings are defined in the dielectric material to expose portions of the conductive material covering the metal region to be plated. Solder can then be electroplated onto the exposed conductive material overlying the metal region. Thereafter, the dielectric material and the conductive material remaining exposed by the solder can be removed, and the solder reflowed to form a solder pad on the metal region. The photodefinable resin remains on the substrate to form a permanent dielectric layer of the multilayer printed circuit board. Because the photodefinable resin can be photoimaged and developed to cover any portion of the metal pad, the photodefinable resin together with the sacrificial dielectric material can be advantageously used to determine the amount of solder that will be deposited during plating. As such, sufficient solder can be readily deposited such that after reflow, the upper surface of the solder can be above or nearly planar with the upper surface of the photodefinable resin. The result is a more uniform topology that facilitates subsequent processing steps.

From the above, it can be appreciated that the photodefinable resin used in the method of this invention can serve multiple roles within a multilayer structure, such as a solder mask, an electroplating contact, a ground plane and/or an EMI shield. In such roles, the resin can have an electrically conductive surface, or can serve solely as an insulating layer within the final multilayer structure. As a solder mask, the photodefinable resin primarily determines the amount of solder that can be deposited during plating, such that appropriate control during photoimaging of the resin can assure that an optimum volume of solder will be deposited. Plating is further promoted because the photodefinable resin can be patterned to cover the perimeter of the metal region and thereby prevent the presence of a recessed area around the metal region, such that adhesion of the conductive material and the solder to the metal region is promoted.

Other advantages of this invention will be better appreciated from the following detailed description.

BRIEF DESCRIPTION OF THE DRAWINGS

The above and other advantages of this invention will become more apparent from the following description taken in conjunction with the accompanying drawings, in which.

DETAILED DESCRIPTION OF A PREFERRED EMBODIMENT

The present invention is directed to a method for sequentially processing a multilayer circuit board, in which a photodefinable dielectric material serves as a mask and permanent dielectric layer of the circuit board. The processing steps of this invention are represented in FIGS. 6 through 10, which illustrate the manner in which solder can be deposited and reflowed to form a solder bump, yet yield a nearly planar topology for a given circuit layer. The printed circuit board construction described and represented in the FIGs. is intended to illustrate the advantageous features of this invention, but is not to be interpreted as limitations to the scope of the invention.

Figure 1A:
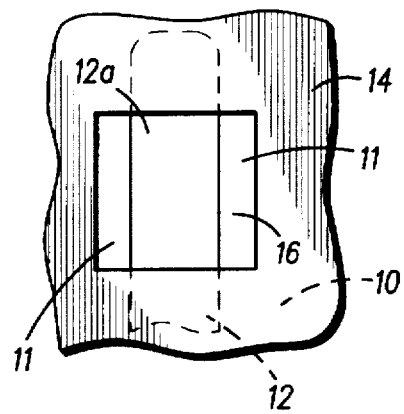
FIGS. 1 through 5, 1A, and 3A represent processing steps for forming solder-plated metal pads of a printed circuit in accordance with the prior art.
Figure 3A:
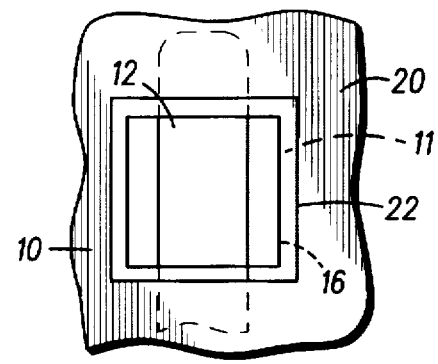
Figure 1:
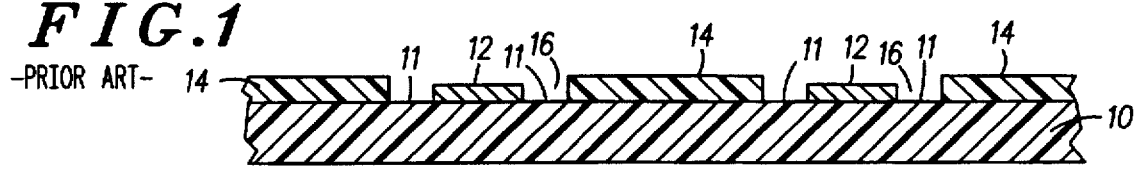
Figure 2:
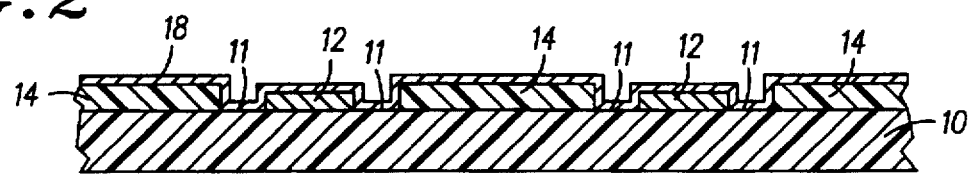
Figure 3:
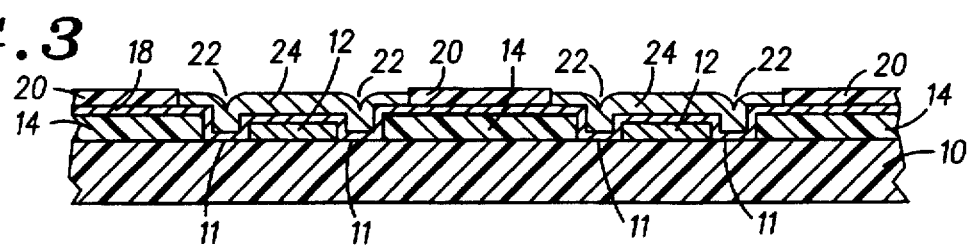
Figure 4:
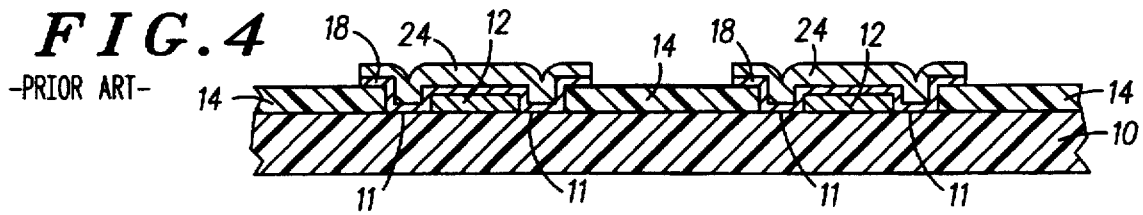
Figure 5:
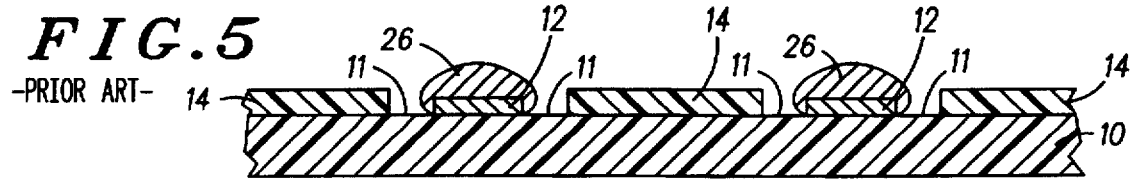
Figure 6:
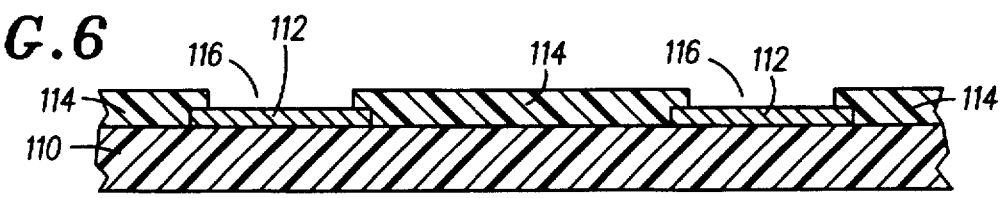
FIGS. 6 through 10 represent processing steps for forming solder-plated metal pads of a printed circuit in accordance with a preferred embodiment of this invention.

Referring to FIG. 6, a substrate 110 is shown on which metal pads 112, typically formed of copper or a copper alloy, have been previously formed. The substrate 110 can be formed from any suitable insulating material, such as plastic, wood, composite, MYLAR, ceramic, or any other suitable electrically insulating material. Those skilled in the art will appreciate that the substrate 110 could be a printed circuit layer of a multilayer circuit board, and subsequent reference to the substrate 110 is intended to encompass such a situation. Shown overlying the substrate 110 and metal pads 112 is a resin layer 114 in which openings 116 have been formed to expose a portion of each metal pad 112. According to this invention, the resin layer 114 is composed of a resin mixture containing a photosensitive material and a catalytic filler. The photosensitive material content of the resin mixture results in the resin layer 114 being photodefinable, such that photoimaging and development techniques can be employed to pattern the openings 116 in the resin layer 114. The resin component of the resin mixture can be any suitable liquid resin or solid resin dissolved in a solvent, so as to enable the resin mixture to be readily deposited onto the surface of the substrate 110 to form the resin layer 114. Resins that could be used include thermoplastic resins, thermosetting resins, elastomers and mixtures thereof, which when incorporated with a photosensitive material yields a photodefinable resin mixture. Desirable properties for the resin mixture include dielectric and physical properties that remain stable throughout deposition and photoimaging of the resin layer 114.

According to this invention, a preferred composition for the resin layer 114 is a photodefinable resin disclosed in U.S. Pat. No. 5,162,144 to Brown et al. and U.S. Pat. No. 5,260,170 to Brown, each of which is commonly assigned with this invention and incorporated herein by reference. In accordance with the teachings of Brown et al. and Brown, a suitable resin component for the resin mixture is an epoxy, while suitable photosensitive materials include a composition available from Ciba-Geigy, Inc., under the trademark PROBIMER 61. Suitable photosensitivity is attained with the PROBIMER 61 material when a photoinitiator is present in amounts of about five percent of the total epoxide molecules that are cross-linked in the final, totally cured resin layer 114. Differing amounts of photoinitiator are recognized as being useful depending on the specific resin formulation and image development process used. The catalytic filler is preferably metal oxide particles that constitute less than about ten weight percent of the resin-oxide mixture. A preferred metal oxide is cuprous oxide, though other oxides or catalytic fillers could be used, including a catalytic material available from Johnson-Matthey of New Jersey, USA, under the trademark CAT-10.

The manner in which the resin mixture is deposited to form the resin layer 114 will depend to some degree on the particular resin component of the mixture. Due to the presence of the photosensitive material, the openings 116 in the resin layer 114 can be photodefined through a mask and developed in the resin layer 114 in a manner consistent with the resin. As shown in FIG. 6, the openings 116 are selectively sized to expose a portion of the metal pads 112 beneath the resin layer 114. While FIG. 6 illustrates the resin layer 114 as overlying the perimeter of each metal pad 112, it is within the scope of this invention that the openings 116 could conform to the perimeter of their respective metal pads 112. Alternatively, the openings 116 could be sized to expose portions of the substrate 110 that connect to the metal pads 112, as will be discussed with reference to FIGS. 11 through 13.

Following formation of the openings 116, the surface of the resin layer 114 is subjected to attack by a chemical such as permanganate or by reactive ion etching, to expose metal oxide particles at and near the surface of the resin layer 114. A reducing agent including borohydride is then applied in a starved manner to convert the exposed metal oxide particles at the surface of the resin layer 114 to islands of catalytic film having a surface resistivity of greater than about $10^6$ ohms per square. According to Brown et al., by limiting the amount of metal oxide in the resin layer 114 to about ten weight percent or less, sufficient oxide is present to form a thin discontinuous catalytic film. This discontinuous film, composed of islands of catalytic film, assures that excessive and uncontrolled plating does not occur on the surface of the resin layer 114 or onto nearby regions of the substrate 110 that are not covered by the resin layer 114. Those skilled in the art will appreciate that, if the above steps of exposing and converting the particles is not performed, the resin layer 114 can be used to serve as a conventional solder mask that can be subjected to typical printed circuit environments, including electroless plating, without effect or change.

Figure 7:
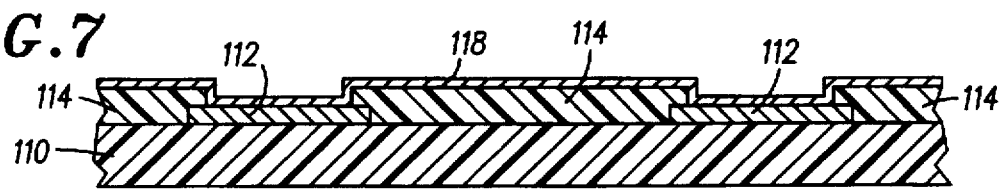

FIG. 7 represents a second step in the process of this invention, in which the catalyzed surface of the resin layer 114 is electrolessly plated with a suitable conductive material, such as copper, nickel or other suitable metal, for a time sufficient to produce an electroless layer 118 over all surfaces of the circuit layer which are metal or are covered by the treated resin layer 114, including those portions of the metal pads 112 exposed by the openings 116. The result is a permanent dielectric layer formed by the resin layer 114, over which lies an electrically conductive layer formed by the electroless layer 118 and electrically interconnected with any metal contacting an edge of the resin layer 114, such as the surface of the opening 116 shown in FIG. 6. At this level, the electroless layer 118 is able to serve as an external ground plane or as an EMI shield for the multilayer circuit board.

Figure 8:
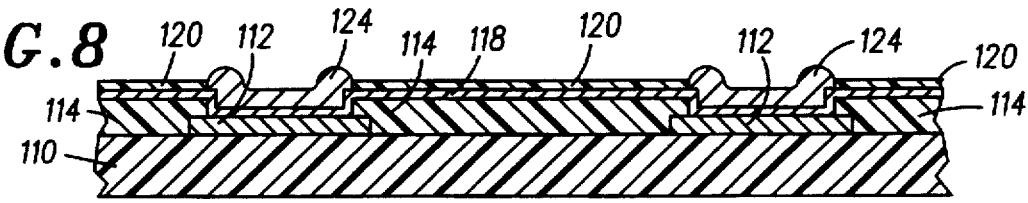
Figure 9:
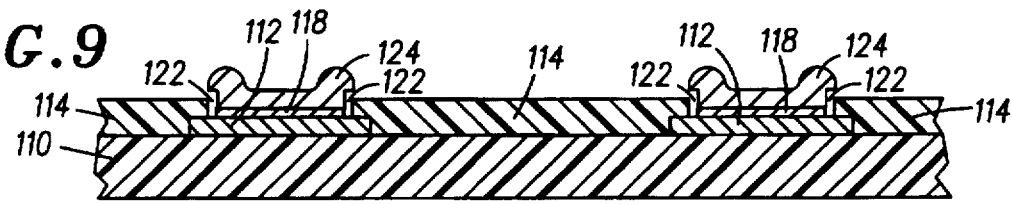
Figure 10:
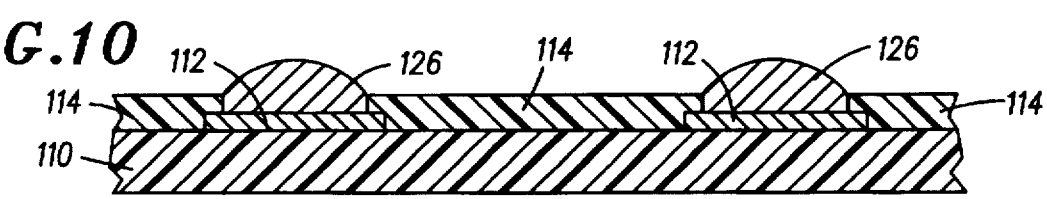

Further processing steps must be performed to form solder bumps on the metal pads 112 for attachment of an electronic component to the substrate 110. These steps are illustrated in FIGS. 8 through 10, and entail depositing a sacrificial dielectric layer, such as a photoresist 120, over the electroless layer 118, and then defining openings 122 in the photoresist 120 using known techniques in order to expose the electroless layer 118 within the openings 116 in the resin layer 114. As shown, the openings 122 are preferably as large as or larger than the openings 116 in the resin layer 114, such that a portion of the electroless layer 118 on the upper surface of the resin layer 114 is exposed, as well as those portions of the electroless layer 118 on the walls of the openings 116. In this manner, tolerances for defining the openings 122 in the photoresist 120 can be accommodated to ensure that the openings 116 in the resin layer 114 serve to predominantly determine the area to where the solder will finally reflow, as shown in FIG. 10, while the opening 122 in the photoresist 120 determines the electroplated area, and hence the volume of solder that will be deposited.

As a result of the above, the photoresist 120 overlies only the planar upper surface of the resin layer 114, such that adhesion of the photoresist 120 is not compromised by the irregular topology created by the openings 116, and better definition of the plated solder composition is made possible. During electroplating, the electroless layer 118 serves as a conductor, with the solder composition 124 being plated onto the electroless layer 118 exposed by the openings 122 in the photoresist 120. In effect, solder plating is confined to the surfaces of the electroless layer 118 within the openings 122 in the photoresist 120. In contrast to the structure of FIGS. 1 through 5, the absence of a recessed area around each metal pad 112 enables the deposition of a more uniform layer of the solder composition 124. The elimination of the relative positional uncertainty of the three independent locating features, i.e., the pad 12, the solder mask opening 16, and the photoresist opening 22 of the prior art shown in FIGS. 1 through 5, enables terminal pads to be placed as closely as dictated by photodefinition of the pads 112 themselves. Thereafter, the photoresist 120 and the electroless layer 118 not covered by the solder composition 124 are stripped, the result of which is represented in FIG. 9. Finally, the solder composition 124 is reflowed to form a solder pad 126 on the metal pad 112, as shown in FIG. 10.

Figure 11:
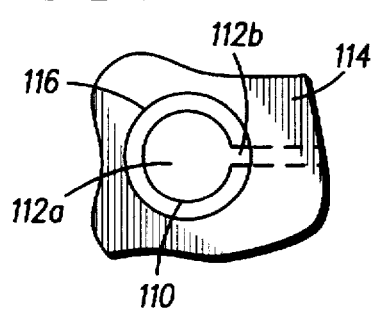
FIGS. 11 through 13 illustrate different solder pad configurations possible with this invention.
Figure 13:
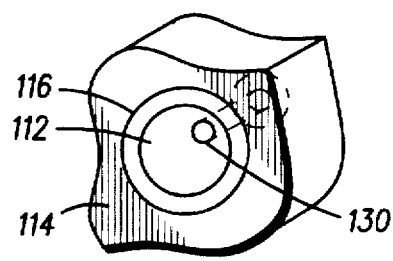
Figure 12:
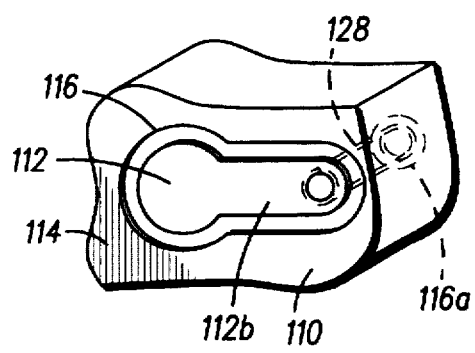

Alternative configurations for the openings 116 are illustrated in FIGS. 11 through 13. FIG. 11 illustrates an embodiment in which the opening 116 in the resin layer 114 is larger than the pad region 112a of a metal pad 112, such that a portion of the surface of the substrate 110 is exposed by the opening 116 prior to deposition of the electroless layer 118. FIG. 11 also shows a conductive extension 112b of the metal pad 112 overlaid by the resin layer 114 in order to provide electrical contact between the electroless layer 118 and the metal pad 112 during plating. FIG. 12 illustrates another embodiment of this invention, in which the metal pad 112, including its conductive extension 112b, is electrically isolated from the resin layer 114 immediately surrounding the pad 112 by the dielectric substrate 110. A conductor 128 within another layer of the multilayer structure is shown as electrically interconnecting the metal pad 112, with access to the conductor 128 being made through a second opening 116a through the resin layer 114. Finally, FIG. 13 illustrates yet another embodiment in which electrical connection to the metal pad 112 is made only through a plated via 130 to a conductor (not shown) within another layer of the multilayer structure.

It will be understood that the process described, excluding reflow, may be used to provide an uncomplicated method of selectively electroplating a wide variety of conductive features, such as component mounting pads that are to be soldered, nonpermanent electrical contact terminals with a nonreflowable metal such as gold, platinum and tin, or other reflowable metals such as indium, or any plateable alloys.

Therefore, while our invention has been described in terms of a preferred embodiment, it is apparent that other forms could be adopted by one skilled in the art, for example by modifying processing parameters, substituting appropriate materials, or utilizing the process of this invention within different applications or other processes. Accordingly, the scope of our invention is to be limited only by the following claims.

The embodiments of the invention in which an exclusive property or privilege is claimed are defined as follows:

1. A masking method comprising the steps of:
   depositing a photodefinable resin containing a catalytic filler on a surface of a substrate and over a metal region present on the substrate;
   photoimaging and developing an opening in the photodefinable resin so as to expose at least a portion of the metal region, the metal region being electrically interconnected with the photodefinable resin;
   treating the photodefinable resin such that the catalytic filler forms a plateable surface on the photodefinable resin;
   electrolessly plating a conductive material on the plateable surface of the photodefinable resin and the portion of the metal region so as to form an electrically conductive layer that is electrically interconnected with the metal region;
   depositing a sacrificial dielectric material over the conductive material;
   defining an opening in the dielectric material so as to expose the conductive material on the portion of the metal region;
   electroplating metal onto the conductive material on the portion of the metal region and exposed by the opening in the dielectric material;
   removing the sacrificial dielectric material to expose underlying conductive material; and
   removing the underlying conductive material.

2. A method as recited in claim 1 wherein the conductive material is electrolessly plated on all exposed surfaces of the photodefinable resin and the portion of the metal region such that the electrically conductive layer is an external ground plane.

3. A method as recited in claim 1 wherein the conductive material is electrolessly plated on all exposed surfaces of the photodefinable resin and the portion of the metal region such that the electrically conductive layer is a shield for electromagnetic interference.

4. A method as recited in claim 1 wherein the catalytic filler comprises metal oxide particles distributed within the photodefinable resin, the metal oxide particles near and at a surface of the photodefinable resin being convertible to form an electroless plating catalyst.

5. A method as recited in claim 4 wherein the metal oxide particles at the surface of the photodefinable resin are converted to form a discontinuous catalytic film on the surface of the photodefinable resin during the treating step.

6. A method as recited in claim 1 wherein the photodefinable resin remaining on the substrate following the photoimaging and developing step forms a permanent dielectric layer on the substrate.

7. A method as recited in claim 1 wherein the photodefinable resin covers a peripheral portion of the metal region after the opening is photoimaged and developed in the photodefinable resin, such that the metal region is electrically interconnected with the photodefinable resin through contact between the photodefinable resin and the peripheral portion of the metal region.

8. A method as recited in claim 1 wherein the photoimaging and developing step forms a gap between the metal region and the photodefinable resin.

9. A method as recited in claim 1 wherein the photoimaging and developing step forms a gap that circumscribes the metal region, the metal region being electrically interconnected with the photodefinable resin through a separate electrical interconnect.

10. A solder masking method comprising the steps of:
    forming a metal region on a surface of a substrate;
    depositing a photodefinable resin containing a catalytic filler on the surface of the substrate and over the metal region;
    photoimaging and developing an opening in the photodefinable resin so as to expose at least a portion of the metal region, the metal region being electrically interconnected with the photodefinable resin;
    treating the photodefinable resin such that the catalytic filler forms a plateable surface on the photodefinable resin;

electrolessly plating a conductive material on the plateable surface of the photodefinable resin and the portion of the metal region;

depositing a sacrificial dielectric material over the conductive material;

defining an opening in the dielectric material so as to expose the conductive material on the portion of the metal region;

electroplating solder onto the conductive material on the portion of the metal region;

removing the dielectric material;

removing the conductive material remaining exposed by the solder; and reflowing the solder after plating.

11. A method as recited in claim 10 wherein the catalytic filler comprises metal oxide particles distributed within the photodefinable resin, the metal oxide particles being convertible to form an electroless plating catalyst.

12. A method as recited in claim 11 wherein the metal oxide particles at the surface of the photodefinable resin are converted to form a discontinuous catalytic film on the surface of the photodefinable resin during the treating step, the catalytic film comprising unconnected islands of catalytic film.

13. A method as recited in claim 10 wherein walls formed by the opening in the photodefinable resin circumscribe the portion of the metal region, the walls and surface portions of the photodefinable resin overlaying the portion of the metal region being plated with solder during the electroless plating step.

14. A method as recited in claim 10 wherein the photodefinable resin remaining on the substrate following the photoimaging and developing step forms a permanent dielectric layer on the substrate.

15. A method as recited in claim 10 wherein the step of removing the conductive material results in the photodefinable resin having no conductive surfaces.

16. A method as recited in claim 10 wherein the photodefinable resin covers a peripheral portion of the metal region after the opening is photoimaged and developed in the photodefinable resin, such that the metal region is electrically interconnected with the photodefinable resin through contact between the photodefinable resin and the peripheral portion of the metal region.

17. A method as recited in claim 10 wherein a portion of the conductive material surrounding the opening in the photodefinable resin is exposed by the opening in the dielectric material.

18. A method as recited in claim 10 wherein the photoimaging and developing step forms a gap between the metal region and the photodefinable resin.

19. A method as recited in claim 10 wherein the photoimaging and developing step forms a gap that circumscribes the metal region, the metal region being electrically interconnected with the photodefinable resin through a separate electrical interconnect.

* * * * *